US012795829B2

(12) United States Patent
Kim et al.

(10) Patent No.: US 12,795,829 B2
(45) Date of Patent: Nov. 10, 2026

(54) ELECTRONIC DEVICE COMPRISING SUPPORT BODY AT WHICH COAXIAL CABLE IS POSITIONED

(71) Applicant: SAMSUNG ELECTRONICS CO., LTD., Suwon-si (KR)

(72) Inventors: Sanguk Kim, Suwon-si (KR); Youngchul Kim, Suwon-si (KR); Youngwoong Kim, Suwon-si (KR); Miryeong Moon, Suwon-si (KR); Doil Ku, Suwon-si (KR); Younghak Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 239 days.

(21) Appl. No.: 18/748,769

(22) Filed: Jun. 20, 2024

(65) Prior Publication Data

US 2024/0341035 A1 Oct. 10, 2024

Related U.S. Application Data

(63) Continuation of application No. PCT/KR2022/020826, filed on Dec. 20, 2022.

(30) Foreign Application Priority Data

Feb. 17, 2022 (KR) ........................ 10-2022-0020612
Feb. 24, 2022 (KR) ........................ 10-2022-0024042

(51) Int. Cl.
*H05K 1/14* (2006.01)
*H05K 5/02* (2006.01)

(52) U.S. Cl.
CPC ............. *H05K 1/14* (2013.01); *H05K 5/0217* (2013.01); *H05K 2201/10356* (2013.01)

(58) Field of Classification Search
CPC ................... H05K 1/14; H05K 5/0217; H05K 2201/10356; H04M 1/02
(Continued)

(56) References Cited

U.S. PATENT DOCUMENTS 6,603,077 B2 * 8/2003 Hirai ...................... H01R 24/44 174/78
7,564,412 B2 * 7/2009 Walker ................. H01Q 1/2266 343/702
(Continued)

FOREIGN PATENT DOCUMENTS

JP H0521968 B2 1/1993
JP 2009060302 A 3/2009
(Continued)

OTHER PUBLICATIONS

International Search Report for PCT/KR2022/020826, mailed Apr. 3, 2023, 6 pages.
(Continued)

*Primary Examiner* — Tuan T Dinh
(74) *Attorney, Agent, or Firm* — Nixon & Vanderhye P.C.

(57) ABSTRACT

This electronic device is an electronic device comprising a coaxial cable connecting a first printed circuit board and a second printed circuit board, wherein a clamp is applied to the coaxial cable, the clamp and a support body are connected to the coaxial cable, and a protruding rib and a recess is formed at the part of the support body where the clamp is positioned.

20 Claims, 10 Drawing Sheets

(58) Field of Classification Search
USPC ............. 361/759, 789, 825–827, 679.27–28, 361/679.57–59; 174/250–258
See application file for complete search history.

(56) References Cited

U.S. PATENT DOCUMENTS

| | | | | |
|---|---|---|---|---|
| 7,906,730 | B2 * | 3/2011 | Atkinson ........... | H01R 13/6474 174/78 |
| 8,576,569 | B2 | 11/2013 | Malek et al. | |
| 2005/0039941 | A1 * | 2/2005 | Marroquin ........... | H01R 13/655 174/78 |
| 2005/0221633 | A1 * | 10/2005 | Wildes ................... | H05K 3/365 439/67 |
| 2017/0245386 | A1 * | 8/2017 | Park .................... | H04M 1/0277 |

FOREIGN PATENT DOCUMENTS

| | | | |
|---|---|---|---|
| JP | 2010258826 | A | 11/2010 |
| JP | 5420003 | B2 | 2/2014 |
| JP | 2015050654 | A | 3/2015 |
| JP | 2016091899 | A | 5/2016 |
| JP | 2017224786 | A | 12/2017 |
| KR | 20130087731 | A | 8/2013 |
| KR | 20170066990 | A | 6/2017 |
| KR | 101809531 | B1 | 12/2017 |
| KR | 20180088172 | A | 8/2018 |

OTHER PUBLICATIONS

Written Opinion of the ISA for PCT/KR2022/020826, mailed Apr. 3, 2023, 5 pages.
Extended European Search Report dated Mar. 10, 2025 issued in European Patent Application No. 22927483.2.

* cited by examiner

ELECTRONIC DEVICE COMPRISING SUPPORT BODY AT WHICH COAXIAL CABLE IS POSITIONED

CROSS-REFERENCE TO RELATED APPLICATIONS

This application is a continuation of International Application No. PCT/KR2022/020826 designating the United States, filed on Dec. 20, 2022, in the Korean Intellectual Property Receiving Office and claiming priority to Korean Patent Application Nos. 10-2022-0020612, filed on Feb. 17, 2022, and 10-2022-0024042, filed on Feb. 24, 2022, in the Korean Intellectual Property Office, the disclosures of each of which are incorporated by reference herein in their entireties.

BACKGROUND

Field

The disclosure relates to an electronic device including a support body on which a coaxial cable is positioned.

Description of Related Art

A coaxial cable having excellent linearity and a decent damping ratio for a signal that is less than or equal to approximately 6 GHz has been used to connect electronic components in an electronic device. A clearance between a signal line and a ground line enclosing the signal line of a coaxial cable may need to be guaranteed to achieve the desired performance of the coaxial cable. The above description is information the inventor(s) acquired during the course of conceiving the present disclosure or already possessed at the time and is not necessarily art publicly known before the present application was filed.

SUMMARY

According to an example embodiment, an electronic device includes: a first printed circuit board (PCB), a second PCB, a connecting assembly including a first coaxial cable connecting the first PCB to the second PCB and a clamp configured to clamp the first coaxial cable, and a support body including a groove configured to accommodate the first coaxial cable therein, wherein the groove includes a first path portion on which the clamp is not positioned and a second path portion on which the clamp is positioned, the first path portion includes a first side surface, a second side surface opposite to the first side surface, and a first bottom surface between the first side surface and the second side surface, the second path portion includes a third side surface, a fourth side surface opposite to the third side surface, and a second bottom surface between the third side surface and the fourth side surface, wherein the second path portion includes a protruding rib protruding toward the fourth side surface from the third side surface and to which the clamp is grounded, and a recessed formed on the fourth side surface.

According to an example embodiment, an electronic device includes: a first PCB, a second PCB, a connecting assembly including a first coaxial cable connecting the first PCB to the second PCB and a clamp configured to clamp the first coaxial cable, and a groove configured to accommodate the first coaxial cable therein, wherein the groove includes a first path portion on which the clamp is not positioned and a second path portion on which the clamp is positioned, the first path portion includes a first side surface, a second side surface opposite to the first side surface, and a first bottom surface between the first side surface and the second side surface, the second path portion includes a third side surface, a fourth side surface opposite to the third side surface, and a second bottom surface between the third side surface and the fourth side surface, wherein the second path portion further includes a plurality of first protrusions arranged on one side surface of the third side surface and the fourth side surface.

According to an example embodiment, an electronic device includes: a first PCB, a second PCB, a connecting assembly including a first coaxial cable connecting the first PCB to the second PCB and a clamp configured to clamp the first coaxial cable, a support body including a groove configured to accommodate the first coaxial cable therein, wherein the groove includes a first path portion on which the clamp is not positioned and a second path portion on which the clamp is positioned, the first path portion includes a first side surface, a second side surface opposite to the first side surface, and a first bottom surface between the first side surface and the second side surface, the second path portion includes a third side surface, a fourth side surface opposite to the third side surface, and a second bottom surface between the third side surface and the fourth side surface, wherein the third side surface is inclined relative to the first side surface, and the fourth side surface is inclined relative to the second side surface.

BRIEF DESCRIPTION OF THE DRAWINGS

The foregoing and other aspects, features, and advantages of certain embodiments in the present disclosure will be more apparent from the following detailed description, taken in conjunction with the accompanying drawings, in which.

DETAILED DESCRIPTION

Figure 1:
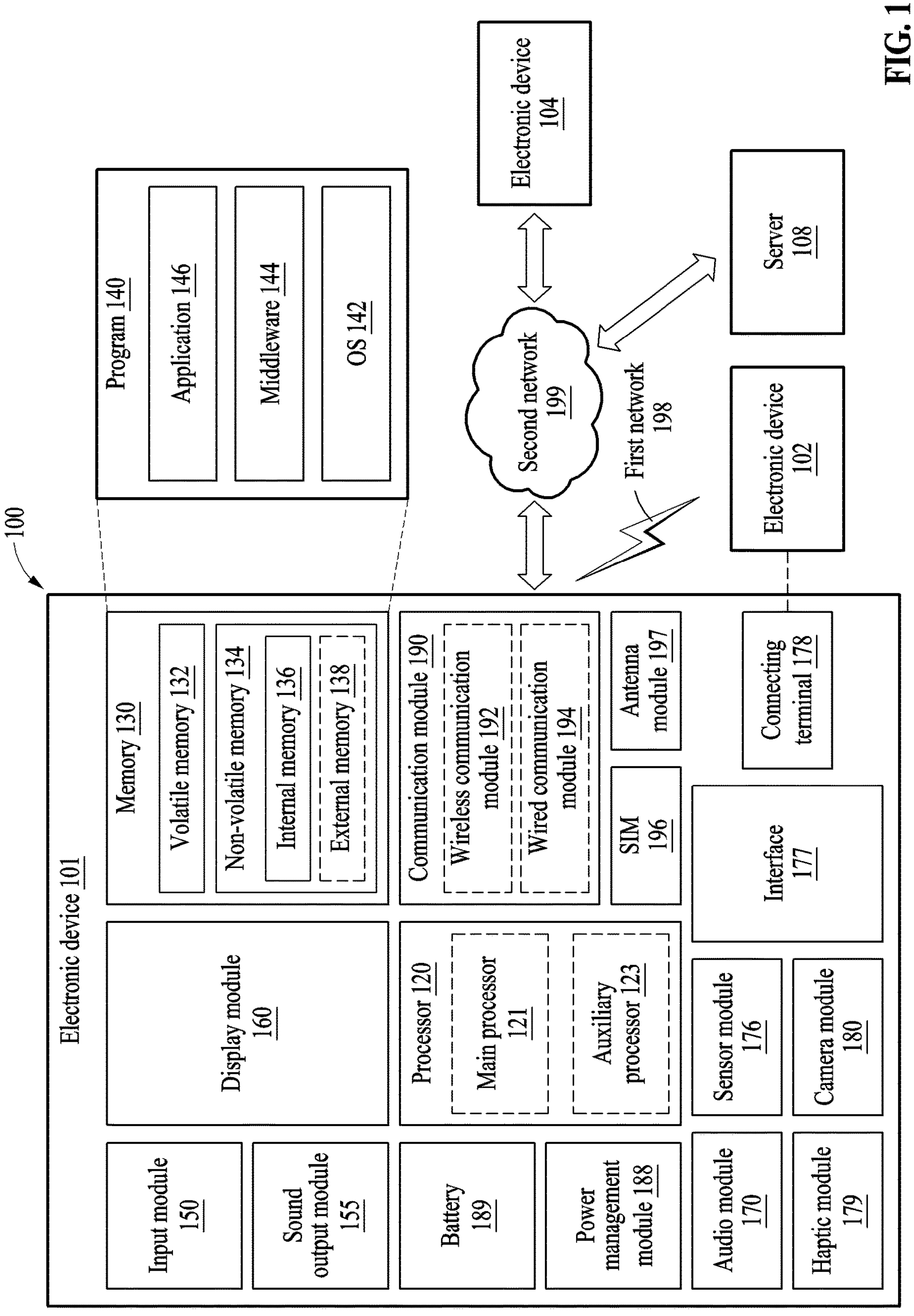
FIG. 1 is a block diagram illustrating an example electronic device in a network environment according to various embodiments.

FIG. 1 is a block diagram illustrating an example electronic device in a network environment according to various embodiments.

Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one (e.g., the connecting terminal 178) of the above components may be omitted from the electronic device 101, or one or more other components may be added in the electronic device 101. In various embodiments, some (e.g., the sensor module 176, the camera module 180, or the antenna module 197) of the components may be integrated as a single component (e.g., the display module 160).

The processor 120 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions. The processor 120 may execute, for example, software (e.g., a program 140) to control at least one other component (e.g., a hardware or software component) of the electronic device 101 connected to the processor 120, and may perform various data processing or computation. According to an embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an embodiment, the auxiliary processor 123 (e.g., an ISP or a CP) may be implemented as a portion of another component (e.g., the camera module 180 or the communication module 190) that is functionally related to the auxiliary processor 123. According to an embodiment, the auxiliary processor 123 (e.g., an NPU) may include a hardware structure specified for artificial intelligence (AI) model processing. An AI model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an embodiment, the display module 160 may include a touch sensor adapted to sense a touch, or a pressure sensor adapted to measure an intensity of a force incurred by the touch.

The audio module 170 may convert a sound into an electrical signal or vice versa. According to an embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to an embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, ISPs, or flashes.

The power management module 188 may manage power supplied to the electronic device 101. According to an embodiment, the power management module 188 may be implemented as, for example, at least a part of a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an embodiment, another component (e.g., a radio frequency integrated circuit (RFIC)) other than the radiating element may be additionally formed as a part of the antenna module 197.

According to an embodiment, the antenna module 197 may form a mmWave antenna module. According to an embodiment, the mmWave antenna module may include a PCB, an RFIC disposed on a first surface (e.g., a bottom surface) of the PCB or adjacent to the first surface and capable of supporting a designated a high-frequency band (e.g., the mm Wave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the result, with or without further processing the result, as at least part of a response to the request. To this end, cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to various embodiments disclosed herein may be one of various types of electronic devices. The electronic device may include, for example, a portable communication device (e.g., a smartphone), a computer device, a portable multimedia device, a portable medical device, a camera, a wearable device, a home appliance device, or the like. According to an embodiment of the present disclosure, the electronic device is not limited to those described above.

It should be appreciated that various embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., by wire), wirelessly, or via a third element.

As used in connection with embodiments of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

According to an embodiment, each component (e.g., a module or a program) of the above-described components may include a single entity or multiple entities, and some of the multiple entities may be separately disposed in different components. According to an embodiment, one or more of the above-described components may be omitted, or one or more other components may be added. Alternatively or additionally, a plurality of components (e.g., modules or programs) may be integrated into a single component. In such a case, according to embodiments, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

Figure 2A:
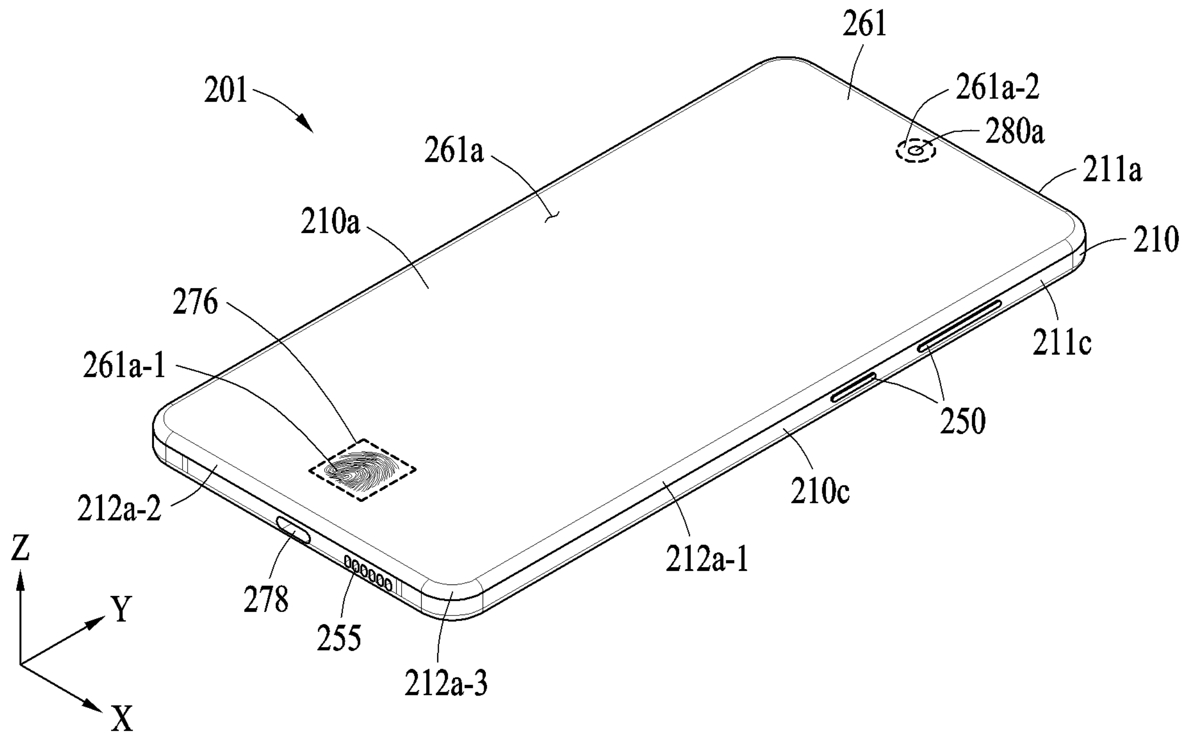
FIG. 2A is a front perspective view of an electronic device according to various embodiments.
Figure 2B:
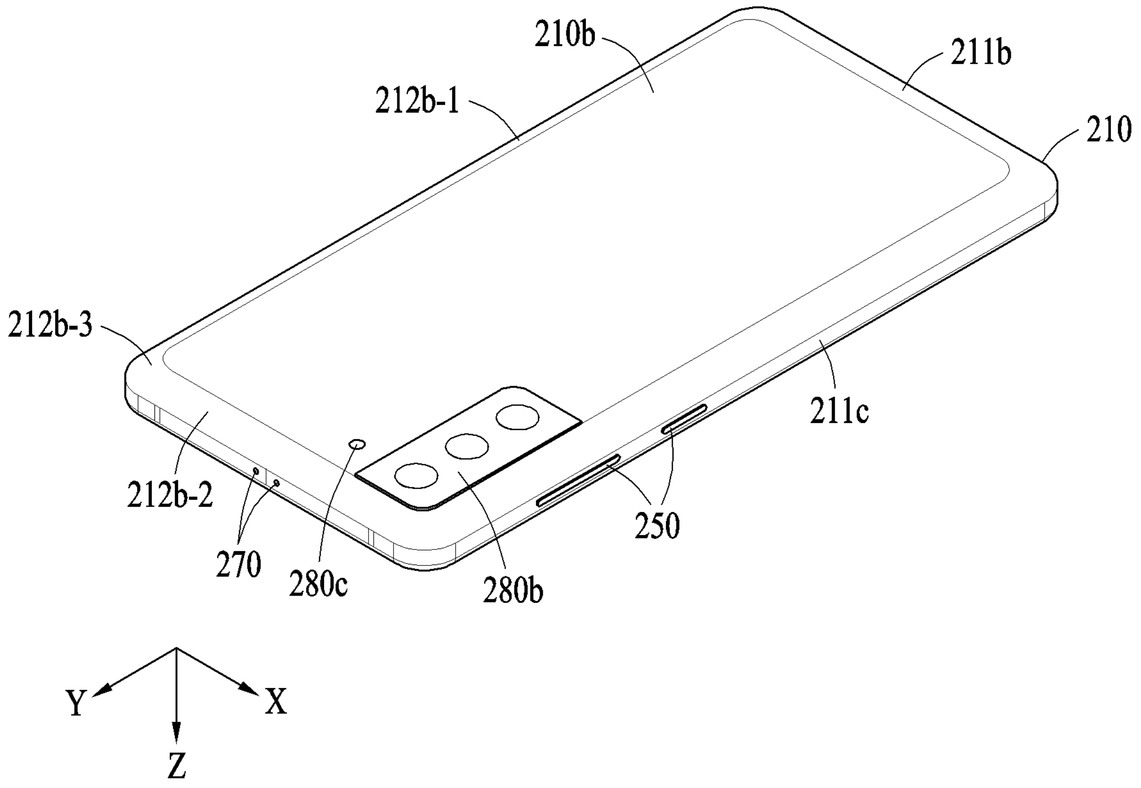
FIG. 2B is a rear perspective view of the electronic device according to various embodiments.
Figure 2C:
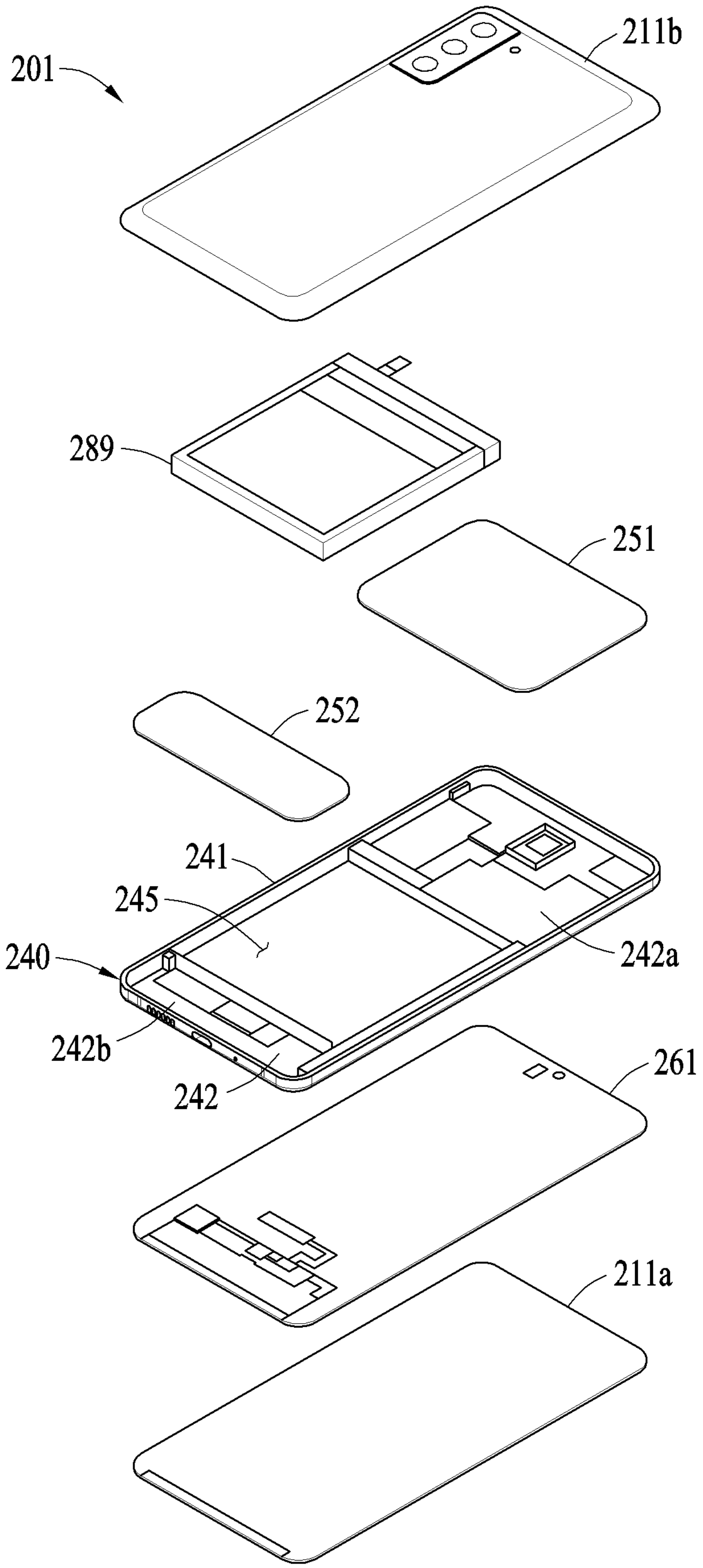
FIG. 2C is an exploded perspective view of an electronic device according to various embodiments.

FIG. 2A is a front perspective view of an electronic device according to various embodiments. FIG. 2B is a rear perspective view of the electronic device according to various embodiments. FIG. 2C is an exploded perspective view of an electronic device according to various embodiments.

Referring to FIGS. 2A, 2B and 2C (which may be referred to as FIGS. 2A to 2C), an electronic device 201 (e.g., the electronic device 101 of FIG. 1) may include a housing 210 including a first surface **210*a* (e.g., a front surface), a second surface 210*b* (e.g., a rear surface), and a third surface 210*c* (e.g., a side surface) enclosing a space between the first surface 210*a* and the second surface 210*b***.

In an embodiment, the first surface **210*a* may be formed by a first plate 211*a* of which at least a portion is substantially transparent. For example, the first plate 211*a* may include a polymer plate or a glass plate including at least one coating layer. The second surface 210*b* may be formed by a second plate 211***b* that is substantially opaque. For example, the second plate 211*b* may be formed of coated or tinted glass, ceramic, polymer, metal (e.g., aluminum, stainless steel (STS), or magnesium), or a combination thereof. The third surface 210*c* may be formed by a frame 211*c* that is coupled to the first plate 211*a* and the second plate 211*b* and includes a metal and/or a polymer. The second plate 211*b* and the frame 211*c* may be integrally and seamlessly formed. The second plate 211*b* and the frame 211*c* may be formed of the same material (e.g., aluminum).

In an embodiment, the first plate 211*a* may include a plurality of first periphery areas 212*a*-1. The plurality of first periphery areas 212*a*-1 may face the second plate 211*b* from at least a partial region of the first surface 210*a*. The plurality of first periphery areas 212*a*-1 may be rounded. The plurality of first periphery areas 212*a*-1 may extend in one direction (e.g., the +/−Y direction). The first plate 211*a* may include a plurality of second periphery areas 212*a*-2. The plurality of second periphery areas 212*a*-2 may face the second plate 211*b* from at least a partial region of the first surface 210*a*. The plurality of second periphery areas 212*a*-2 may be rounded. The plurality of second periphery areas 212*a*-2 may extend in another direction (e.g., the +/−X direction). The first plate 211*a* may include a plurality of third periphery areas 212*a*-3. The plurality of third periphery areas 212*a*-3 may face the second plate 211*b* from at least a partial region of the first surface 210*a*. The plurality of third periphery areas 212*a*-3 may be rounded. The plurality of third periphery areas 212*a*-3 may be between the plurality of first periphery areas 212*a*-1 and the plurality of second periphery areas 212*a*-2.

In an embodiment, the second plate 211*b* may include a plurality of fourth periphery areas 212*b*-1. The plurality of fourth periphery areas 212*b*-1 may face the first plate 211*a* from at least a partial region of the second surface 210*b*. The plurality of fourth periphery areas 212*b*-1 may be rounded. The plurality of fourth periphery areas 212*b*-1 may extend in one direction (e.g., the +/−Y direction). The second plate 211*b* may include a plurality of fifth periphery areas 212*b*-2. The plurality of fifth periphery areas 212*b*-2 may face the first plate 211*a* from at least a partial region of the second surface 210*b*. The plurality of fifth periphery areas 212*b*-2 may be rounded. The plurality of fifth periphery areas 212*b*-2 may extend in another direction (e.g., the +/−X direction). The second plate 211*b* may include a plurality of sixth periphery areas 212*b*-3. The plurality of sixth periphery areas 212*b*-3 may face the first plate 211*a* from at least a partial region of the second surface 210*b*. The plurality of sixth periphery areas 212*b*-3 may be rounded. The plurality of sixth periphery areas 212*b*-3 may be between the plurality of fourth periphery areas 212*b*-1 and the plurality of fifth periphery areas 212*b*-2.

In an embodiment, the electronic device 201 may include a display 261 (e.g., the display module 160 of FIG. 1). The display 261 may be positioned on the first surface 210*a*. The display 261 may be visible through at least a portion (e.g., the plurality of first periphery areas 212*a*-1, the plurality of second periphery areas 212*a*-2, and the plurality of third periphery areas 212*a*-3) of the first plate 211*a*. The display 261 may have a shape that is substantially the same as the shape of an outer edge of the first plate 211*a*. The periphery of the display 261 may substantially coincide with the outer edge of the first plate 211*a*. The display 261 may include a touch-sensing circuit, a pressure sensor for measuring the intensity (pressure) of a touch, and/or a digitizer for detecting a magnetic-type stylus pen. The display 261 may include a screen display area 261*a* that is visible to display content using pixels. The screen display area 261*a* may include a sensing area 261*a*-1 and/or a camera area 261*a*-2. The sensing area 261*a*-1 may overlap at least one area of the screen display area 261*a*. The sensing area 261*a*-1 may allow transmission of an input signal related to a sensor module 276 (e.g., the sensor module 176 of FIG. 1). The sensing area 261*a*-1 may display content, like the screen display area 261*a* that does not overlap the sensing area 261*a*-1. For example, the sensing area 261*a*-1 may display the content while the sensor module 276 is not operating. The camera area 261*a*-2 may overlap at least one area of the screen display area 261*a*. The camera area 261*a*-2 may allow transmission of an optical signal related to a first camera module 280*a* (e.g., the camera module 180 of FIG. 1). The camera area 261*a*-2 may display content, like the screen display area 261*a* that does not overlap the camera area 261*a*-2. For example, the camera area 261*a*-2 may display the content while the first camera module 280*a* is not operating.

In an embodiment, the electronic device 201 may include an audio module 270 (e.g., the audio module 170 of FIG. 1). The audio module 270 may be positioned on the third surface 210C. The audio module 270 may obtain a sound through at least one hole.

In an embodiment, the electronic device 201 may include the sensor module 276. The sensor module 276 may be positioned on the first surface 210*a*. The sensor module 276 may form the sensing area 261*a*-1 in at least a portion of the screen display area 261*a*. The sensor module 276 may receive an input signal transmitted through the sensing area 261*a*-1 and generate an electrical signal based on the received input signal. In an example, the input signal may have a designated physical quantity (e.g., heat, light, temperature, sound, pressure, or ultrasound). As another example, the input signal may include a signal related to biometric information (e.g., a fingerprint) of a user.

In an embodiment, the electronic device 201 may include the first camera module 280*a*, a second camera module 280*b* (e.g., the camera module 180 of FIG. 1), and a flash 280*c*. The first camera module 280*a* may be positioned on the first surface 210*a*. The second camera module 280*b* and the flash 280*c* may be positioned on the second surface 210*b*. At least a portion of the first camera module 280*a* may be positioned under the display 261. The first camera module 280*a* may receive an optical signal transmitted through the camera area 261*a*-2. The second camera module 280*b* may include a plurality of camera modules (e.g., a dual camera, a triple camera, or a quad camera). The flash 280*c* may include a light-emitting diode or a xenon lamp.

In an embodiment, the electronic device 201 may include a sound output module 255 (e.g., the sound output module 155). The sound output module 255 may be positioned on the third surface 210*c*. The sound output module 255 may include one or more holes.

In an embodiment, the electronic device 201 may include an input module 250 (e.g., the input module 150 of FIG. 1). The input module 250 may be positioned on the third surface 210*c*. The input module 250 may include at least one key input device.

In an embodiment, the electronic device 201 may include a connecting terminal 278 (e.g., the connecting terminal 178 of FIG. 1). The connecting terminal 278 may be positioned on the third surface 210*c*. For example, when the electronic device 201 is viewed in one direction (e.g., the +Y direction), the connecting terminal 278 may be positioned at a central portion of the third surface 210*c*, and the sound output module 255 may be positioned on one side (e.g., a right side) with respect to the connecting terminal 278.

In an embodiment, the electronic device 201 may include a support body 240, a first circuit board 251, a second circuit board 252, and a battery 289 (e.g., the battery 189 of FIG. 1). At least a portion of the support body 240 may form the housing 210 together with the first plate 211*a* and the second plate 211*b*. The support body 240 may include a frame structure 241 (e.g., the frame 211*c*) and a plate structure 242. The frame structure 241 may be formed to surround a periphery of the plate structure 242. The frame structure 241 may connect the periphery of the first plate 211*a* and the periphery of the second plate 211*b*. The frame structure 241 may enclose a space between the first plate 211*a* and the second plate 211*b*. The frame structure 241 may form the third surface 210*c* of the electronic device 201. The plate structure 242 may include a first portion 242*a* for accommodating the first circuit board 251 and a second portion 242*b* for accommodating the second circuit board 252. The display 261 may be positioned on one surface (e.g., a bottom surface) of the plate structure 242, and the first circuit board 251 and the second circuit board 252 may be positioned on the other surface (e.g., a top surface) of the plate structure 242. The plate structure 242 may include an opening 245 positioned between the first portion 242*a* and the second portion 242*b* and passing through both surfaces of the plate structure 242. The opening 245 may accommodate the battery 289.

The description provided herein may also apply to electronic devices of various shapes/forms (e.g., a foldable electronic device, a slidable electronic device, a digital camera, a digital video camera, a tablet PC, a laptop computer, and other electronic devices), in addition to the electronic device shown in FIGS. 2A to 2C.

Figure 3A:
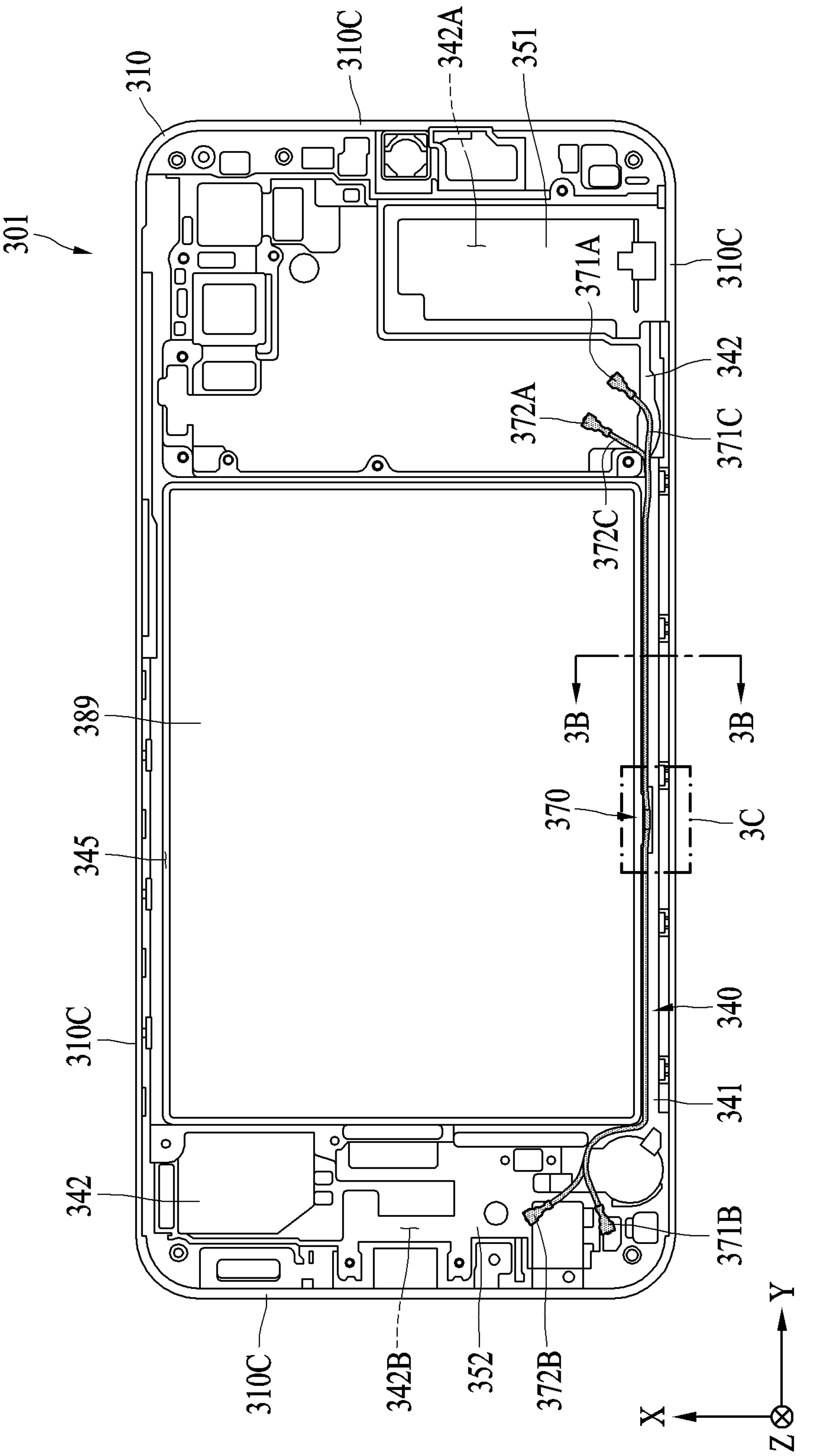
FIG. 3A is a diagram illustrating a plan view of an internal structure of an electronic device according to various embodiments.
Figure 3B:
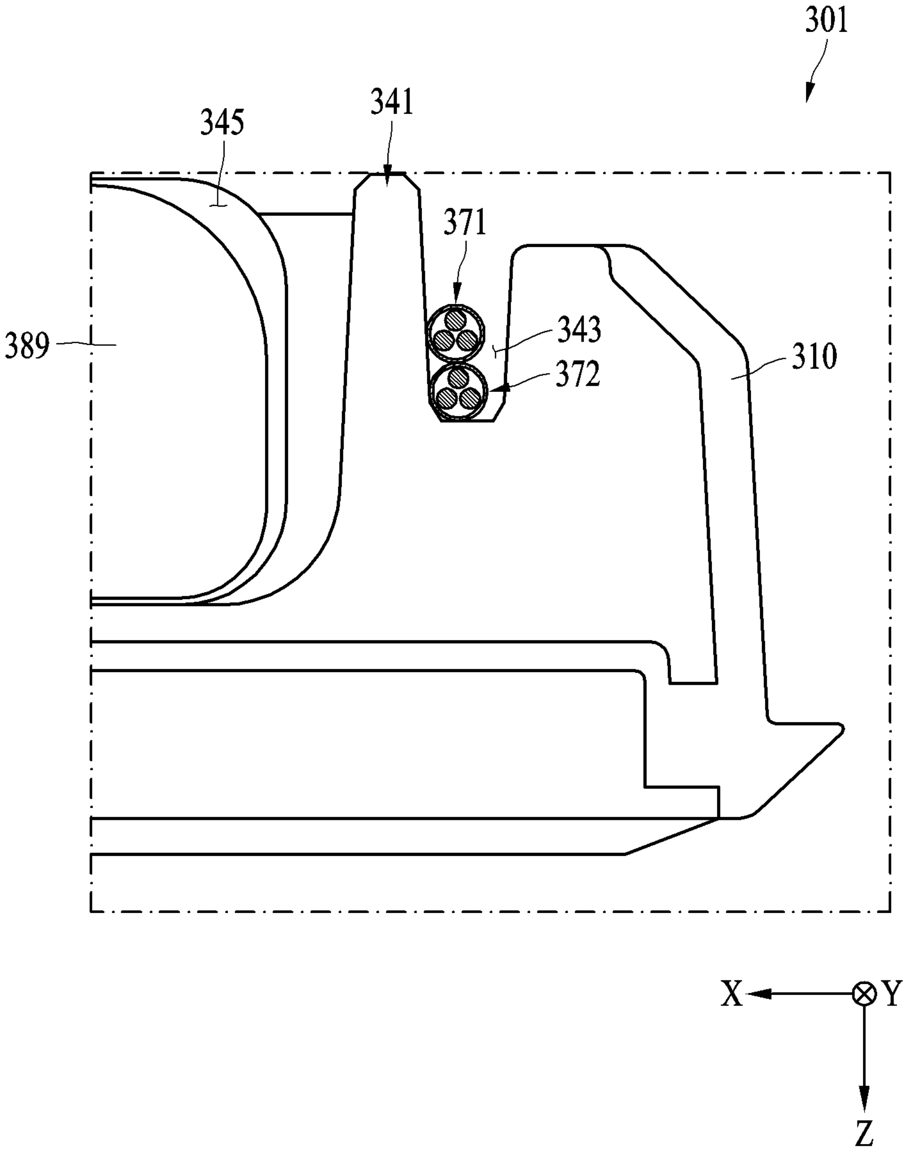
FIG. 3B is a cross-sectional view of a support body and coaxial cables taken along line 3B-3B of FIG. 3A according to various embodiments.
Figure 3C:
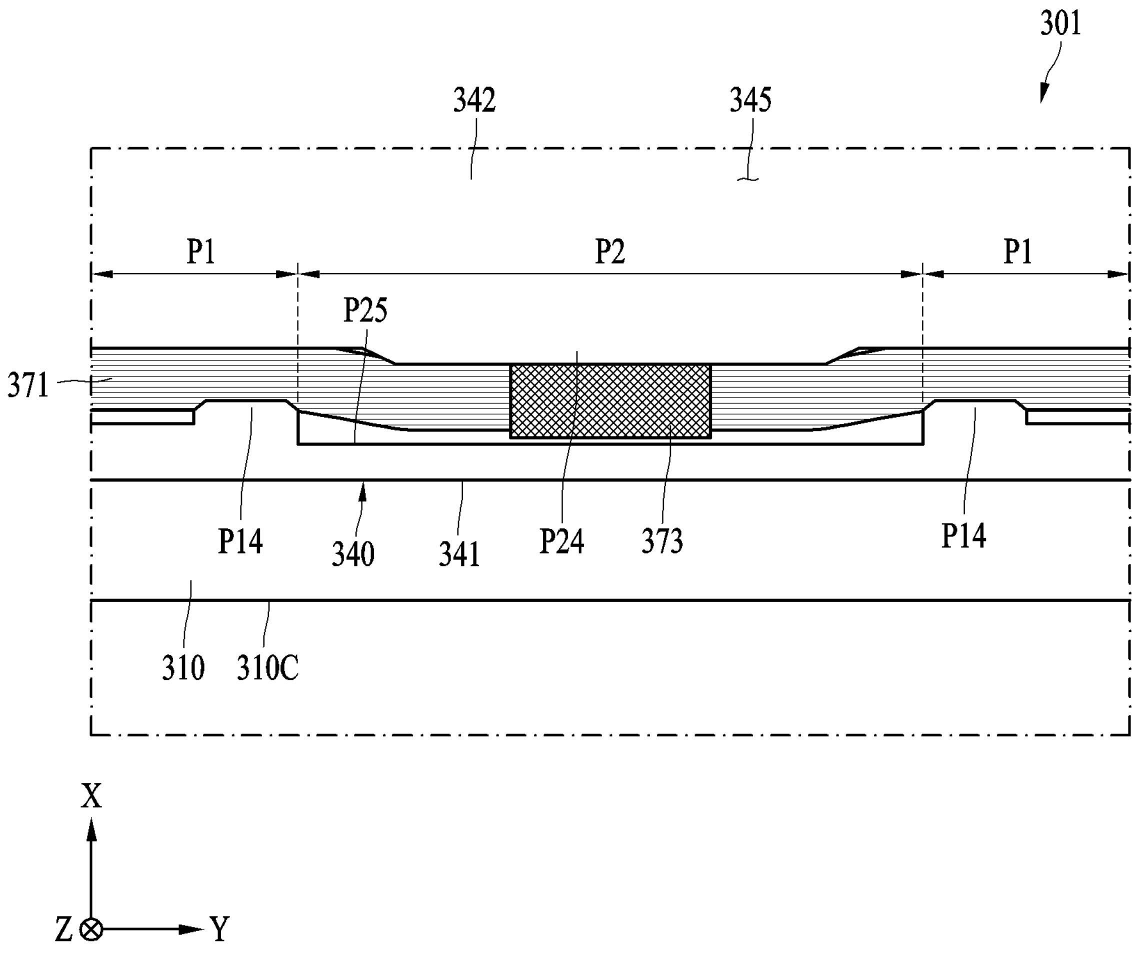
FIG. 3C is a diagram illustrating an enlarged view of a portion 3C of FIG. 3A according to various embodiments.
Figure 3D:
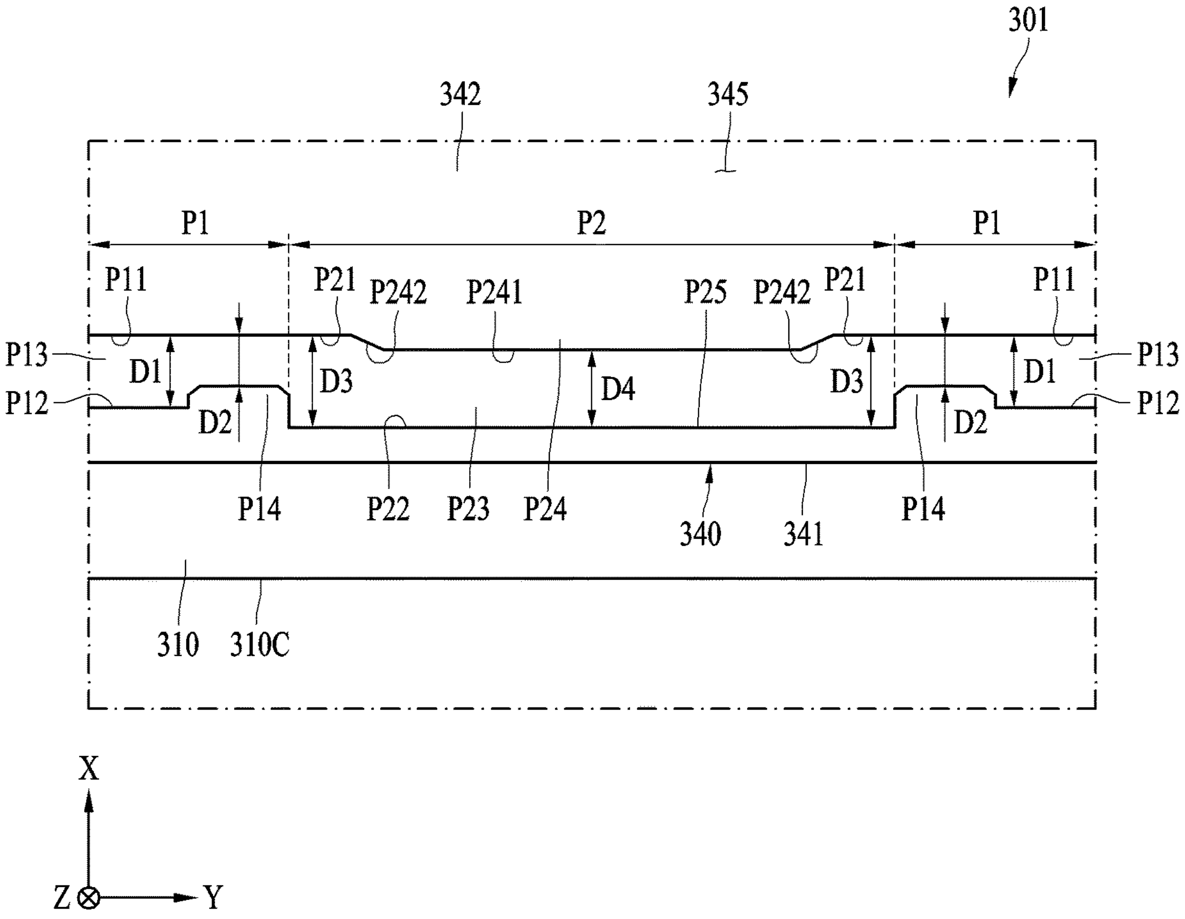
FIG. 3D is a diagram illustrating a plan view of a support body according to various embodiments.

FIG. 3A is a diagram illustrating a plan view of an internal structure of an electronic device according to various embodiments. FIG. 3B is a cross-sectional view of a support body and coaxial cables taken along line 3B-3B of FIG. 3A according to various embodiments. FIG. 3C is a diagram illustrating an enlarged view of a portion 3C of FIG. 3A according to various embodiments. FIG. 3D is a diagram illustrating a plan view of a support body according to various embodiments.

Referring to FIGS. 3A, 3B, 3C and 3D (which may be referred to as FIGS. 3A to 3D), an electronic device 301 (e.g., the electronic device 101 of FIG. 1 and/or the electronic device 201 of FIGS. 2A to 2C) may include a housing 310 (e.g., the housing 210 of FIGS. 2A to 2C) including a first surface (e.g., the first surface 210*a* of FIGS. 2A to 2C), a second surface (e.g., the second surface 210*b* of FIGS. 2A to 2C), and a plurality of side surfaces 310C (e.g., the third surface 210*c* of FIGS. 2A to 2C).

In an embodiment, the electronic device 301 may include a support body 340 (e.g., the support body 240 of FIGS. 2A to 2C) disposed inside the housing 310. The support body 340 may include a frame structure 341 (e.g., the frame structure 241 of FIGS. 2A to 2C) and a plate structure 342 (e.g., the plate structure 242 of FIGS. 2A to 2C).

In an embodiment, the frame structure 341 may include a groove 343 configured to accommodate at least one component (e.g., coaxial cables 371 and 372) therein. The groove 343 may be formed on an edge area of the frame structure 341 in a longitudinal direction (e.g., the +/−Y direction) along one surface 310C of the plurality of side surfaces 310C of the housing 310.

In an embodiment, the groove 343 may have a substantially constant width (e.g., the size in the +/−X direction) in a depth direction (e.g., the +/−Z direction) of the groove 343. The groove 343 may have a width that gradually decreases in the depth direction (e.g., the +/−Z direction) of the groove 343.

In an embodiment, the groove 343 may include a plurality of path portions P1 and P2 passing through at least one component (e.g., the coaxial cables 371 and 372) in different directions. For example, the groove 343 may include the first path portion P1 having a determined path and the second path portion P2 positioned on the first path portion P1 and having a modified path that is different from the path of the first path portion P1. The coaxial cables 371 and 372 may proceed along the path of the first path portion P1 and may proceed along the modified path in the second path portion P2.

In an embodiment, the first path portion P1 may include a first side surface P11, a second side surface P12 that is opposite to the first side surface P11, and a first bottom surface P13 between the first side surface P11 and the second side surface P12. The first side surface P11 may be oriented to the side surface 310C (e.g., be oriented in the −X direction) of the housing 310. The second side surface P12 may be oriented to an accommodation part 345 (e.g., be oriented in the +X direction) of the plate structure 342. The second path portion P2 may include a third side surface P21, a fourth side surface P22 that is opposite to the third side surface P21, and a second bottom surface P23 between the third side surface P21 and the fourth side surface P22. The third side surface P21 may be oriented to the side surface 310C (e.g., be oriented in the −X direction) of the housing 310. The fourth side surface P22 may be oriented to the accommodation part 345 (e.g., be oriented in the +X direction) of the plate structure 342.

In an embodiment, the first path portion P1 may include at least one protrusion P14 protruding toward the first side surface P11 from the second side surface P12. For example, a surface of the protrusion P14 facing the first side surface P11 may have an arbitrary surface (e.g., a substantially smooth flat surface) that is suitable for not damaging at least one component (e.g., the coaxial cables 371 and 372) in the first path portion P1.

In an embodiment, the protrusion P14 may be disposed adjacent to the second path portion P2 or immediately before entering the second path portion P2.

In an embodiment, the protrusion P14 may be formed on an entirety of the second side surface P12 in the depth direction (e.g., the +/−Z direction) of the groove 343. The protrusion P14 may be formed on a portion of the second side surface P12 in the depth direction (e.g., the +/−Z direction) of the groove 343. For example, the protrusion P14 may be offset from the first bottom surface P13.

In an embodiment, the second path portion P2 may include a protruding rib P24 protruding toward the fourth side surface P22 from the third side surface P21. The protruding rib P24 may extend in a path direction (e.g., the +/−Y direction) of the second path portion P2 along the third side surface P21. The protruding rib P24 may partially extend along the third side surface P21. The protruding rib P24 may substantially cross an entirety of the third side surface P21.

In an embodiment, the protruding rib P24 may be formed throughout the entirety of the third side surface P21 in the depth direction (e.g., the +/−Z direction) of the groove 343. The protruding rib P24 may be substantially formed on a portion of the third side surface P21 in the depth direction (e.g., the +/−Z direction) of the groove 343. For example, the protruding rib P24 may be offset from the second bottom surface P23.

In an embodiment, the protruding rib P24 may include a substantially flat first rib surface P241 and a pair of second rib surfaces P242 formed on both sides of the first rib surface P241 inclinedly to the first rib surface P241. The pair of second rib surfaces P242 may continue to the third side surface P21 and/or the first side surface P11.

In an embodiment, the second path portion P2 may include a recess P25 recessed in the fourth side surface P22. The recess P25 may secure an arrangement space of at least one component (e.g., the coaxial cables 371 and 372) in the second path portion P2 that may decrease due to the protruding rib P24.

In an embodiment, the recess P25 may extend in a path direction (e.g., the +/−Y direction) of the second path portion P2 along the fourth side surface P22. The recess P25 may be formed throughout an entirety of the fourth side surface P22. The recess P25 may be partially formed on the fourth side surface P22.

In an embodiment, the groove 343 may have different widths (e.g., the size in the +/−X direction) at least some positions throughout the first path portion P1 and the second path portion P2. For example, a distance D1 between the first side surface P11 and the second side surface P12 may be approximately 0.9 mm, a distance D2 between the first side surface P11 and the protrusion P14 may be approximately 0.65 mm, a distance D3 between the third side surface P21 and the fourth side surface P22 (or the recess P25) may be approximately 1.1 mm, and a distance D4 between the protruding rib P24 and the fourth side surface P22 (or the recess P25) may be approximately 1.0 mm.

However, for example, when a path change generated by the third side surface P21 and the fourth side surface P22 (or the recess P25) is able to achieve stable grounding (e.g., grounding between the protruding rib P24 and a clamp 373), the size of the distances described above may be variously determined to have a margin by considering the size of at least one component (e.g., the coaxial cables 371 and 372 and/or the clamp 373).

In an embodiment, the plate structure 342 may include a first portion 342A (e.g., an upper portion or the first portion 242*a* of FIGS. 2A to 2C), a second portion 342B (e.g., the second portion 242*b* of FIGS. 2A to 2C) disposed opposite to the first portion 342A, and an accommodation portion 345 (e.g., the opening 245 of FIGS. 2A to 2C) disposed between the first portion 342A and the second portion 342B and configured to accommodate at least a portion of a battery 389 (e.g., the battery 289 of FIGS. 2A to 2C).

In an embodiment, the frame structure 341 and the plate structure 342 may be integrally and seamlessly formed as one. The frame structure 341 and the plate structure 342 may be separate components and may be connected, coupled, or combined with each other in an arbitrary and suitable manner (e.g., double injection).

In an embodiment, at least a portion of the frame structure 341 and the plate structure 342 may be formed of a conductive material (e.g., a metal material). In an embodiment, the groove 343 may be formed of a conductive material (e.g., a metal material).

In an embodiment, the electronic device 301 may include a first PCB 351 (e.g., the first circuit board 251 of FIGS. 2A to 2C) disposed on the first portion 342A of the plate structure 342 and a second PCB 352 (e.g., the second circuit board 252 of FIGS. 2A to 2C) disposed on the second portion 342B of the plate structure 342.

In an embodiment, the electronic device 301 may include a connecting assembly 370 that connects the first PCB 351 to the second PCB 352. The connecting assembly 370 may include at least one of the coaxial cables 371 and 372 configured to transmit a signal between the first PCB 351 and the second PCB 352 and at least one clamp 373 configured to clamp the at least one of coaxial cables 371 and 372 to the support body 340.

In an embodiment, the connecting assembly 370 may include the first coaxial cable 371 configured to transmit a signal in a first frequency band and the second coaxial cable 372 configured to transmit a signal in a second frequency band that is different from the first frequency band. Unlike the shown embodiment, the connecting assembly 370 may include at least three coaxial cables. The connecting assembly 370 may include a single coaxial cable (e.g., the first coaxial cable 371 or the second coaxial cable 372).

In an embodiment, the first coaxial cable 371 may include a first receptacle 371A disposed on the first PCB 351. The first coaxial cable 371 may include a second receptacle 371B disposed on the second PCB 352. The first coaxial cable 371 may include a first extension 371C extending between the first receptacle 371A and the second receptacle 371B. The second coaxial cable 372 may include a third receptacle 372A disposed on the first PCB 351. The second coaxial cable 372 may include a fourth receptacle 372B disposed on the second PCB 352. The second coaxial cable 372 may include a second extension 372C extending between the third receptacle 372A and the fourth receptacle 372B.

In an embodiment, the first coaxial cable 371 may be positioned on the second coaxial cable 372. For example, at least a portion of the first extension 371C may be positioned on at least a portion of the second extension 372C. In the groove 343, the first coaxial cable 371 may be positioned on the second coaxial cable 372. The first coaxial cable 371 may contact the side surface of the groove 343 and may not contact the bottom surface of the groove 343, whereas the second coaxial cable 372 may contact the side surface and/or the bottom surface of the groove 343.

In an embodiment, the first coaxial cable 371 may be pushed to the first side surface P11 by the first protrusion P1. The first protrusion P1 may not push the second coaxial cable 372. The first protrusion P1 may also push the second coaxial cable 372.

In an embodiment, the clamp 373 may be configured to clamp the first coaxial cable 371 to the groove 343. The first coaxial cable 371 may be grounded to the support body 340 through the clamp 373.

In an embodiment, the second coaxial cable 372 may be grounded to the support body 340 by contacting the side surface and/or the bottom surface of the groove 343 without the clamp 373. In an embodiment that is not shown, the second coaxial cable 372 may be grounded to the support body 340 by an additional clamp by considering a signal transmitted by the second coaxial cable 372, thickness (e.g., a diameter) of the coaxial cable 372, a width (e.g., the size in the +/−X direction) of the groove 343 on which the second coaxial cable 372 is positioned, and/or other parameters.

In an embodiment, the clamp 373 may not be positioned on the first path portion P1 and may be positioned on the second path portion P2. The clamp 373 may also be positioned on the first path portion P1.

In an embodiment, the clamp 373 may be in contact with the protruding rib P24. For example, the grounding of the clamp 373 and the protruding rib P24 may be strengthened due to a path change of the first coaxial cable 371 proceeding the first path portion P1 and the second path portion P2 as the protrusion P14 pushes the first coaxial cable 371.

In an embodiment, the clamp 373 may be positioned to correspond to the protruding rib P24. For example, the clamp 373 may be positioned on a central portion of the protruding rib P24. As another example, the clamp 373 may be positioned on a portion out of the central portion of the protruding rib P24.

In an embodiment, the clamp 373 may be positioned to correspond to the recess P25. For example, the clamp 373 may be positioned on a central portion of the recess P25. As another example, the clamp 373 may be positioned on a portion out of the central portion of the recess P25.

In an embodiment, the clamp 373 may be formed of a conductive material. For example, the clamp 373 may be formed of a metal material.

In an embodiment, the length (e.g., the length in the +/−Y direction) of the clamp 373 may be substantially equal to or less than the length (e.g., an extended length in the +/−Y direction) of the protruding rib P24. As the length of the protruding rib P24 in contact with the clamp 373 is sufficiently secured, the stable grounding between the clamp 373 and the protruding rib P24 may be maintained.

In an embodiment, the clamp 373 may not be in contact with the recess P25. The clamp 373 may have an arbitrary size (e.g., the width in the +/−X direction) that is suitable for contacting both the protruding rib P24 and the recess P25.

Figure 4:
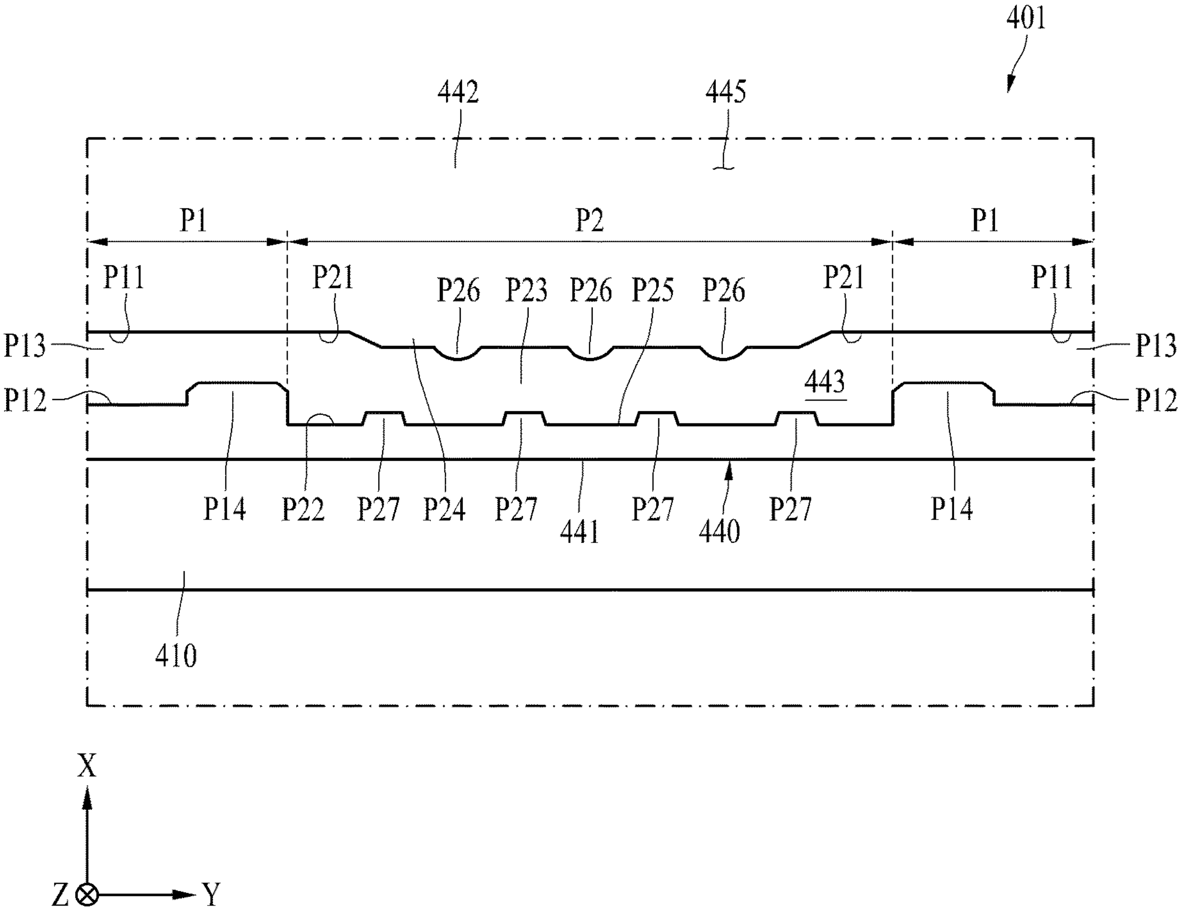
FIG. 4 is a diagram illustrating a plan view of a support body according to various embodiments.

FIG. 4 is a diagram illustrating a plan view of a support body according to various embodiments.

Referring to FIG. 4, an electronic device 401 (e.g., the electronic device 301 of FIGS. 3A to 3D) may include a housing 410 (e.g., the housing 310 of FIGS. 3A to 3D) and a support body 440 (e.g., the support body 340 of FIGS. 3A to 3D). The support body 440 may include a frame structure 441 (e.g., the frame structure 341 of FIGS. 3A to 3D) including a groove 443 (e.g., the groove 343 of FIGS. 3A to 3D) and a plate structure 442 (e.g., the plate structure 342 of FIGS. 3A to 3D) including an accommodation portion 445 (e.g., the accommodation portion 345 of FIGS. 3A to 3D). The groove 443 may include the first path portion P1 and the second path portion P2. The first path portion P1 may include the first side surface P11, the second side surface P12, and the first bottom surface P13. The second path portion P2 may include the third side surface P21, the fourth side surface P22, and the second bottom surface P23.

In an embodiment, the first path portion P1 may include the protrusion P14 (e.g., the protrusion P14 of FIGS. 3C and 3D).

In an embodiment, the second path portion P2 may include the protruding rib P24 (e.g., the protruding rib P24 of FIGS. 3C and 3D). The second path portion P2 may not include the protruding rib P24.

In an embodiment, the second path portion P2 may include the recess P25 (e.g., the recess P25 of FIGS. 3C and 3D). The second path portion P2 may not include the recess P25.

In an embodiment, the second path portion P2 may include at least one first protrusion P26 disposed on the second side surface P21. For example, when positioning a coaxial cable (e.g., the first coaxial cable 371 and/or the second coaxial cable 372 of FIGS. 3A to 3D) on the second path portion P2, the first protrusion P26 may strengthen grounding between the support body 440 (e.g., the third side surface P21 and/or the protruding rib P24) and the coaxial cable and/or a clamp (e.g., the clamp 373 of FIGS. 3A to 3D) without interfering with the positioning of the coaxial cable in the second path portion P2.

In an embodiment, the second path portion P2 may include a plurality of first protrusions P26 arranged on the third side surface P21 and/or the protruding rib P24 in a path direction (e.g., the +/−Y direction) of the second path portion P2.

In an embodiment, the first protrusion P26 may be formed substantially throughout the third side surface P21 and/or the protruding rib P24 in the depth direction (e.g., the +/−Z direction) of the groove 443. The first protrusion P26 may be formed on a portion of the protruding rib P24 and/or the third side surface P21 in the depth direction (e.g., the +/−Z direction) of the groove 443. For example, the first protrusion P26 may be offset from the second bottom surface P23.

In an embodiment, the second path portion P2 may include at least one second protrusion P27 disposed on the fourth side surface P22. For example, when positioning a coaxial cable (e.g., the first coaxial cable 371 and/or the second coaxial cable 372) on the second path portion P2, the second protrusion P27 may strengthen grounding between the support body 440 (e.g., the third side surface P21 and/or the protruding rib P24) and the coaxial cable and/or a clamp (e.g., the clamp 373 of FIGS. 3A to 3D) without interfering with the positioning of the coaxial cable in the second path portion P2.

In an embodiment, the second path portion P2 may include a plurality of second protrusions P27 arranged on the fourth side surface P22 in the path direction (e.g., the +/−Y direction) of the second path portion P2.

In an embodiment, when viewing from the orientation (e.g., the −X direction) of the third side surface P21 and/or the orientation (e.g., the +X direction) of the fourth side surface P22, the second protrusion P27 may be positioned to not overlap the first protrusion P26. The first protrusion P26 and the second protrusion P27 may be positioned to substantially completely overlap or partially overlap each other.

In an embodiment, the second protrusion P27 may be formed substantially throughout the fourth side surface P21 and/or the recess P25 in the depth direction (e.g., the +/−Z direction) of the groove 443. The second protrusion P27 may be formed on a portion of the recess P25 and/or the fourth side surface P21 in the depth direction (e.g., the +/−Z direction) of the groove 443. For example, the second protrusion P27 may be offset from the second bottom surface P23.

In an embodiment, the protruding length and/or the extended length of the first protrusion P26 and/or the second protrusion P27 may be less than the protruding length and/or the extended length of the protrusion P14 of the first path portion P1. The protruding length and/or the extended length of the first protrusion P26 and/or the second protrusion P27 may be substantially equal to or greater than the protruding length and/or the extended length of the protrusion P14 of the first path portion P1.

Figure 5:
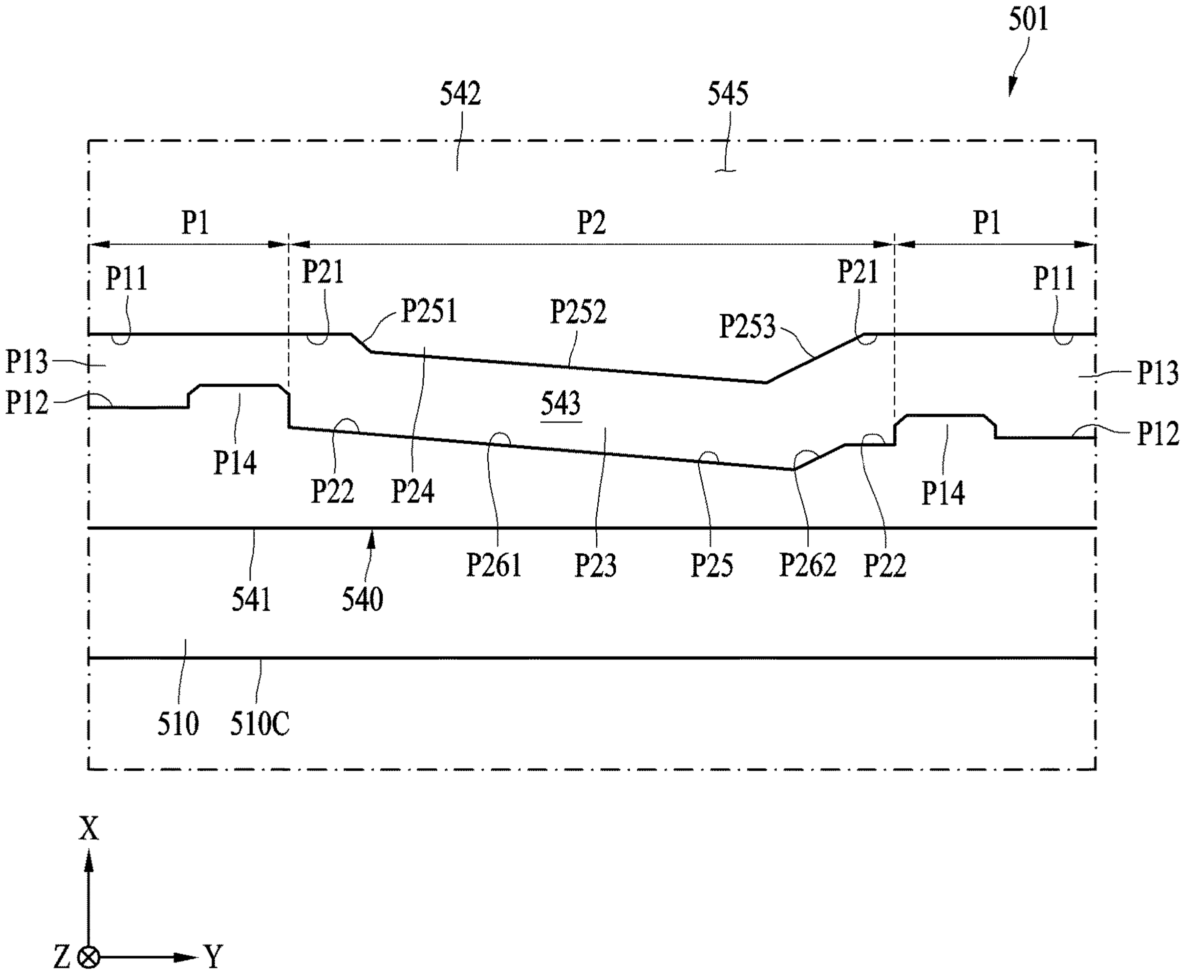
FIG. 5 is a diagram illustrating a plan view of a support body according to various embodiments.

FIG. 5 is a diagram illustrating a plan view of a support body according to various embodiments.

Referring to FIG. 5, an electronic device 501 (e.g., the electronic device 301 of FIGS. 3A to 3D) may include a housing 510 (e.g., the housing 310 of FIGS. 3A to 3D) and a support body 540 (e.g., the support body 340 of FIGS. 3A to 3D). The support body 540 may include a frame structure 541 (e.g., the frame structure 341 of FIGS. 3A to 3D) including a groove 543 (e.g., the groove 343 of FIGS. 3A to 3D) and a plate structure 542 (e.g., the plate structure 342 of FIGS. 3A to 3D) including an accommodation portion 545 (e.g., the accommodation portion 345 of FIGS. 3A to 3D). The groove 543 may include the first path portion P1 and the second path portion P2. The first path portion P1 may include the first side surface P11, the second side surface P12, and the first bottom surface P13. The second path portion P2 may include the third side surface P21, the fourth side surface P22, and the second bottom surface P23.

In an embodiment, the first path portion P1 may include the protrusion P14 (e.g., the protrusion P14 of FIGS. 3C and 3D).

In an embodiment, the second path portion P2 may include the protruding rib P24 (e.g., the protruding rib P24 of FIGS. 3C and 3D). The second path portion P2 may not include the protruding rib P24.

In an embodiment, the second path portion P2 may include the recess P25 (e.g., the recess P25 of FIGS. 3C and 3D). The second path portion P2 may not include the recess P25.

In an embodiment, the third side surface P21 may include at least one of first inclined portions P251, P252, and P253 inclined relative to the first side surface P11. Due to the rigidity and/or conductivity of a coaxial cable (e.g., the first coaxial cable 371 or the second coaxial cable 372 of FIGS. 3A to 3D) and/or a clamp (e.g., the clamp 373 of FIGS. 3A to 3D), grounding between the first inclined portion P251, P252, or P253 and the coaxial cable and/or the clamp may be strengthened. Even when the width between the third side surface P21 and the fourth side surface P22 is substantially equal to or greater than the width of the coaxial cable and/or the clamp, the grounding between the first inclined portion P251, P252, or P253 and the coaxial cable and/or the clamp may be strengthened.

In an embodiment, the first inclined portions P251, P252, P253 may include the first inclined area P251 inclined at a first angle relative to the first side surface P11, a second inclined area P252 connected to the first inclined area P251 and inclined at a second angle that is different from the first angle relative to the first side surface P11, and a third inclined area P253 connected to the second inclined area P252 and inclined at a third angle that is different from the first angle and the second angle relative to the first side surface P11. The first inclined portions P251, P252, and P253 may be formed of at least two of the first inclined area P251, the second inclined area P252, and the third inclined area P253. The first inclined portions P251, P252, and P253 may further include additional inclined areas other than the shown inclined areas.

In an embodiment, the first inclined area P251 and/or the third inclined area P253 may continue to the third side surface P21. The first inclined area P251 and/or the third inclined area P253 may directly continue to the first side surface P11.

In an embodiment, at least one of the first inclined area P251, the second inclined area P252, and the third inclined area P253 may be formed on the protruding rib P24.

In an embodiment, the fourth side surface P22 may include at least one of second inclined portions P261 and P262 inclined relative to the second side surface P12. Due to the rigidity and/or conductivity of a coaxial cable (e.g., the first coaxial cable 371 or the second coaxial cable 372) and/or a clamp (e.g., the clamp 373), grounding between the second inclined portion P261 or P262 and the coaxial cable and/or the clamp may be strengthened. Even when the width between the third side surface P21 and the fourth side surface P22 is substantially equal to or greater than the width of the coaxial cable and/or the clamp, the grounding between the second inclined portion P261 or P262 and the coaxial cable and/or the clamp may be strengthened.

In an embodiment, the second inclined portions P261 and P262 may include the fourth inclined area P261 inclined at a fourth angle relative to the second side surface P12 and the fifth inclined area P262 connected to the fourth inclined area P261 and inclined at a fifth angle that is different from the fourth angle relative to the second side surface P12. The second inclined portions P261 and P262 may further include additional inclined areas other than the shown inclined areas.

In an embodiment, the fourth inclined area P261 and/or the fifth inclined area P262 may continue to the fourth side surface P22. The fourth inclined area P261 and/or the fifth inclined area P262 may directly continue to the second side surface P12.

In an embodiment, at least one of the fourth inclined area P261 and the fifth inclined area P262 may be formed on the recess P25.

An aspect of the present disclosure may provide an electronic device for stably grounding a coaxial cable.

According to an embodiment, the electronic device 301 may further include the first PCB 351. The electronic device 301 may include the second PCB 352. The electronic device 301 may include the connecting assembly 370. The connecting assembly 370 may include the first coaxial cable 371 that connects the first PCB 351 to the second PCB 352. The connecting assembly 370 may include the clamp 373 configured to clamp the first coaxial cable 371. The electronic device 301 may include the support body 340. The support body 340 may include the groove 343 configured to accommodate the first coaxial cable 371. The groove 343 may include the first path portion P1 on which the clamp 373 is not positioned. The groove 343 may include the second path portion P2 on which the clamp 373 is positioned. The first path portion P1 may include the first side surface P11, the second side surface P12 that is opposite to the first side surface P11, and the first bottom surface P13 between the first side surface P11 and the second side surface P12. The second path portion P2 may include the third side surface P21, the fourth side surface P22 that is opposite to the third side surface P21, and the second bottom surface P23 between the third side surface P21 and the fourth side surface P22. The second path portion P2 may include the protruding rib P24, which protrudes toward the fourth side surface P22 from the third side surface P21 and to which the clamp 373 is grounded. The second path portion P2 may include the recess P25 formed on the fourth side surface P22.

In an embodiment, the length of the protruding rib P24 along the third side surface P21 may be substantially equal to or greater than the length of the clamp 373 along the third side surface P21.

In an embodiment, the protruding rib P24 and the recess P25 may be positioned to correspond to the clamp 373.

In an embodiment, the protruding rib P24 may be partially formed along the third side surface P21.

In an embodiment, the recess P25 may be formed throughout the entire fourth side surface P22.

In an embodiment, the distance D4 between the protruding rib P24 and the recess P25 may be substantially equal to or less than the distance D3 between the third side surface P21 and the recess P25.

In an embodiment, the first path portion P1 may further include at least one protrusion P14 protruding toward the first side surface P11 from the second side surface P12 and configured to push the first coaxial cable 371.

In an embodiment, the at least one protrusion P14 may be disposed in an area of the second side surface P12 adjacent to the fourth side surface P22.

In an embodiment, the electronic device 201, 301 may include the housing 310 including the first surface 210*a*, the second surface 210*b* that is opposite to the first surface 210*a*, and the side surfaces 210*c*, 310C between the first surface 210*a* and the second surface 210*b*. The protruding rib P24 and the recess P25 may be formed toward the side surface 210*c*, 310C of the housing 310.

In an embodiment, the connecting assembly 370 may include the second coaxial cable 372. The second coaxial cable 372 may include the first PCB 351 and the second PCB 352. The second coaxial cable 372 may be configured to transmit a signal in a frequency band that is different from a frequency band of a signal transmitted by the first coaxial cable 371. The second coaxial cable 372 may be configured not to be clamped by the clamp.

In an embodiment, the second coaxial cable 372 may be positioned closer to the first bottom surface P13 and the second bottom surface P23 than the first coaxial cable 371 and may be accommodated in the groove 343.

In an embodiment, the groove 343 may have a width that is substantially constant or decreases in the depth direction toward the first bottom surface P13 and/or the second bottom surface P23.

In an embodiment, the protruding rib P24 and the recess P25 may be at least partially formed on the third side surface P21 and the fourth side surface P22 in the depth direction of the groove 343, respectively.

According to an example embodiment, the electronic device may include a first PCB. The electronic device may include a second PCB. The electronic device may include a connecting assembly. The connecting assembly may include a first coaxial cable connecting the first PCB to the second PCB. The connecting assembly may include s clamp configured to clamp the first coaxial cable. The electronic device may include a support body. The support body may include a groove configured to accommodate the first coaxial cable. The groove may include a first path portion on which the clamp is not positioned. The groove may include a second path portion P2 on which the clamp is positioned. The first path portion may include a first side surface, a second side surface opposite to the first side surface, and a first bottom surface between the first side surface and the second side surface. The second path portion may include a third side surface, a fourth side surface opposite to the third side surface, and a second bottom surface between the third side surface and the fourth side surface. The second path portion may further include a plurality of first protrusions arranged on one side surface of the third side surface P21 and the fourth side surface.

In an example embodiment, the second path portion may further include a plurality of second protrusions arranged on the other side surface of the third side surface and the fourth side surface.

In an example embodiment, the second path portion may include a protruding rib protruding toward the fourth side surface from the third side surface on which the clamp is grounded, and to which the plurality of first protrusions is positioned. The second path portion may include a recess, formed on the fourth side surface and on which the plurality of second protrusions is positioned.

In an example embodiment, when viewing in the direction toward the fourth side surface from the third side surface, the plurality of first protrusions may be positioned to not overlap the plurality of second protrusions.

According to an example embodiment, the electronic device may include the first PCB. The electronic device may include the second PCB. The electronic device may include the connecting assembly. The connecting assembly may include the first coaxial cable connecting the first PCB to the second PCB. The connecting assembly may include the clamp configured to clamp the first coaxial cable. The electronic device may include the support body. The support body may include the groove 343, 543 configured to accommodate the first coaxial cable. The groove may include the first path portion on which the clamp is not positioned. The groove may include the second path portion on which the clamp is positioned. The first path portion may include the first side surface, the second side surface opposite to the first side surface, and the first bottom surface between the first side surface and the second side surface. The second path portion may include the third side surface, the fourth side surface opposite to the third side surface, and the second bottom surface between the third side surface and the fourth side surface. The third side surface may be inclined relative to the first side surface. The fourth side surface may be inclined relative to the second side surface.

In an example embodiment, the clamp may be configured to be grounded to one side surface of the third side surface and the fourth side surface.

In an example embodiment, the distance between the third side surface and the fourth side surface may be substantially equal to or greater than the width of the clamp.

According to an embodiment, the stability of grounding of the coaxial cable may be improved. The effects of the electronic device according to various example embodiments are not limited to the above-mentioned effects, and other unmentioned effects can be clearly understood from the following description by one of ordinary skill in the art.

The various example embodiments of the present disclosure are intended to be illustrative and not restrictive. Various modifications may be made without departing from the true spirit and full scope of the disclosure, including the appended claims. Any of the embodiment(s) described herein may be used in combination with any other embodiment(s) described herein.

What is claimed is:

1. An electronic device, comprising:
a first printed circuit board (PCB),
a second PCB,
a first coaxial cable connecting the first PCB to the second PCB,
a clamp configured to clamp the first coaxial cable, and
a support body comprising a groove configured to accommodate the first coaxial cable therein,
wherein the groove comprises:
a first path portion on which the clamp is not positioned, and
a second path portion on which the clamp is positioned,
wherein the first path portion comprises:
a first side surface,
a second side surface opposite to the first side surface, and
a first bottom surface between the first side surface and the second side surface,
wherein the second path portion comprises:
a third side surface,
a fourth side surface opposite to the third side surface, and
a second bottom surface between the third side surface and the fourth side surface,
wherein the second path portion comprises:
a protruding rib protruding toward the fourth side surface from the third side surface and to which the clamp is grounded, and
a recess formed on the fourth side surface.

2. The electronic device of claim 1, wherein a length of the protruding rib along the third side surface is substantially equal to or greater than a length of the clamp along the third side surface.

3. The electronic device of claim 1, wherein the protruding rib and the recess are positioned to correspond to the clamp.

4. The electronic device of claim 1, wherein the protruding rib is partially formed along the third side surface.

5. The electronic device of claim 1, wherein the recess is formed throughout an entirety of the fourth side surface.

6. The electronic device of claim 1, wherein a distance between the protruding rib and the recess is substantially equal or less than a distance between the third side surface and the recess.

7. The electronic device of claim 1, wherein the first path portion further comprises at least one protrusion configured to push the first coaxial cable and the at least one protrusion protrudes from the second side surface toward the first side surface.

8. The electronic device of claim 7, wherein the at least one protrusion is positioned in an area of the second side surface adjacent to the fourth side surface.

9. The electronic device of claim 1, further comprising a housing, wherein the housing comprises:

a first surface, a second surface opposite to the first surface, and a side surface between the first surface and the second surface, wherein the protruding rib and the recess is formed toward the side surface of the housing.

10. The electronic device of claim 1, further comprising a second coaxial cable connecting the first PCB to the second PCB, wherein the second coaxial cable is configured to transmit a signal in a frequency band different from a frequency band of a signal transmitted by the first coaxial cable, and the second coaxial cable is configured to not be clamped by the clamp.

11. The electronic device of claim 10, wherein the second coaxial cable is positioned closer to the first bottom surface and the second bottom surface than the first coaxial cable and/or is accommodated in the groove.

12. The electronic device of claim 10, wherein the groove has a substantially constant width or a width that decreases in a depth direction toward the first bottom surface and/or the second bottom surface.

13. The electronic device of claim 10, wherein the protruding rib and the recess are at least partially formed on the third side surface and the fourth side surface in a depth direction of the groove, respectively.

14. An electronic device, comprising:

a first printed circuit board (PCB), a second PCB, a first coaxial cable connecting the first PCB and the second PCB, a clamp configured to clamp the first coaxial cable, and a support body comprising a groove configured to accommodate the first coaxial cable therein, wherein the groove comprises:

a first path portion on which the clamp is not positioned, and a second path portion on which the clamp is positioned, wherein the first path portion comprises:

a first side surface, a second side surface opposite to the first side surface, and a first bottom surface between the first side surface and the second side surface, wherein the second path portion comprises:

a third side surface, a fourth side surface opposite to the third side surface, and a second bottom surface between the third side surface and the fourth side surface, and wherein the second path portion further comprises a plurality of first protrusions arranged on one side surface of the third side surface and the fourth side surface.

15. The electronic device of claim 14, wherein the second path portion further comprises a plurality of second protrusions arranged on the other side surface of the third side surface and the fourth side surface.

16. The electronic device of claim 15, wherein the second path portion further comprises:

a protrusion rib protruding from the third side surface toward the fourth side surface, to which the clamp is grounded, and on which the plurality of first protrusions is positioned, and a recess on the fourth side surface and on which the plurality of second protrusions is positioned.

17. The electronic device of claim 12, wherein the plurality of first protrusions are positioned to not overlap the plurality of second protrusions when viewing in a direction toward the fourth side surface from the third side surface.

18. TheAn electronic device, comprising:

a first printed circuit board (PCB), a second PCB, a first coaxial cable connecting the first PCB and the second PCB, a clamp configured to clamp the first coaxial cable, and a support body comprising a groove configured to accommodate the first coaxial cable therein, wherein the groove comprises:

a first path portion on which the clamp is not positioned, and a second path portion on which the clamp is positioned, wherein the first path portion comprises:

a first side surface, a second side surface opposite to the first side surface, and a first bottom surface between the first side surface and the second side surface, wherein the second path portion comprises:

a third side surface, a fourth side surface opposite to the third side surface, and a second bottom surface between the third side surface and the fourth side surface, and wherein the third side surface is inclined relative to the first side surface, and the fourth side surface is inclined relative to the second side surface.

19. The electronic device of claim 18, wherein the clamp is configured to be grounded to at least one side surface of the third side surface and the fourth side surface.

20. The electronic device of claim 18, wherein a distance between the third side surface and the fourth side surface is substantially equal to or greater than a width of the clamp.

* * * * *